US012615708B2

(12) United States Patent
Huang et al.

(10) Patent No.: US 12,615,708 B2
(45) Date of Patent: Apr. 28, 2026

(54) SWITCHING POWER CONVERTER MODULE WITH A HEAT DISSIPATION STRUCTURE

(71) Applicant: NAVITAS SEMICONDUCTOR LIMITED, Dublin (IE)

(72) Inventors: Xiucheng Huang, Torrance, CA (US); Yingchuan Lei, Shanghai (CN); Weijing Du, Torrance, CA (US); Yun Zhou, Shenzhen (CN)

(73) Assignee: Navitas Semiconductor Limited, Dublin (IE)

( * ) Notice: Subject to any disclaimer, the term of this patent is extended or adjusted under 35 U.S.C. 154(b) by 125 days.

(21) Appl. No.: 18/461,400

(22) Filed: Sep. 5, 2023

(65) Prior Publication Data

US 2024/0098876 A1     Mar. 21, 2024

(51) Int. Cl.
H05K 1/00          (2006.01)
H05K 1/02          (2006.01)
H05K 3/30          (2006.01)
H05K 9/00          (2006.01)

(52) U.S. Cl.
CPC ............. H05K 1/0206 (2013.01); H05K 3/30 (2013.01); H05K 9/0022 (2013.01); H05K 2201/1003 (2013.01)

(58) Field of Classification Search
CPC ...... H05K 1/0206; H05K 3/30; H05K 9/0022; H05K 2201/1003
USPC .......................................................... 361/720
See application file for complete search history.

(56) References Cited

U.S. PATENT DOCUMENTS

| | | | |
|---|---|---|---|
| 2010/0033282 A1* | 2/2010 | Hsu ........................ | H05K 1/141 |
| | | | 336/65 |
| 2010/0301981 A1* | 12/2010 | Zeng ................... | H01F 27/2885 |
| | | | 336/105 |
| 2014/0009251 A1* | 1/2014 | Hsu ........................ | H01F 27/085 |
| | | | 336/57 |
| 2021/0274656 A1* | 9/2021 | Xiong ................... | H05K 3/3494 |
| 2021/0321527 A1* | 10/2021 | Ma ....................... | H01L 23/3675 |
| 2023/0030746 A1* | 2/2023 | Sahoo ................. | H01L 23/4334 |

* cited by examiner

*Primary Examiner* — Zhengfu J Feng
(74) *Attorney, Agent, or Firm* — FisherBroyles, LLP

(57)          ABSTRACT

An electronic device is disclosed. In one aspect, the electronic device includes a printed circuit board (PCB) having a first surface and a second surface opposite the first surface, where the PCB includes a thermally conductive region having a plurality of vias that extend from the first surface to the second surface; a semiconductor device attached to the second surface of the PCB and overlying the thermally conductive region; a transformer having a magnetic core; a shield arranged to partially enclose the transformer and define an opening; and an insert disposed within the opening, attached to the first surface of the PCB and overlying the thermally conductive region.

20 Claims, 4 Drawing Sheets

200

214

212

208

206

202

220

204

210

216

SWITCHING POWER CONVERTER MODULE WITH A HEAT DISSIPATION STRUCTURE

CROSS-REFERENCE TO RELATED APPLICATIONS

The present application claims priority to Chinese Patent Application No. 202211130305.5 filed on Sep. 16, 2022, entitled "Heat Dissipation Structure and Design Method of Switching Power Supply", the contents of which are incorporated herein by reference in their entirety for all purposes.

FIELD

The described embodiments relate generally to switching power supplies, and more particularly, the present embodiments relate to a switching power converter module with a heat dissipation structure.

BACKGROUND

Electronic devices such as computers, servers and televisions, among others, employ one or more electrical power conversion circuits to convert one form of electrical energy to another. Some electrical power conversion circuits use switching power supplies such as a flyback converter. Switching power supplies can efficiently convert power from a source to a load. Switching power supplies may have relatively high power conversion efficiency, as compared to other types of power converters. Switching power supplies may also be substantially smaller and lighter than a linear supply due to the smaller transformer size and weight.

SUMMARY

In some embodiments, an electronic device is disclosed. The electronic device includes a printed circuit board (PCB) having a first surface and a second surface opposite the first surface, where the PCB includes a thermally conductive region having a plurality of vias that extend from the first surface to the second surface; a semiconductor device attached to the second surface of the PCB and overlying the thermally conductive region; a transformer having a magnetic core; a shield arranged to partially enclose the transformer and define an opening; and an insert disposed within the opening, attached to the first surface of the PCB and overlying the thermally conductive region.

In some embodiments, the insert is formed from copper, aluminum, or an alloy of copper and/or aluminum.

In some embodiments, the insert is directly coupled to the shield.

In some embodiments, the semiconductor device is a gallium nitride (GaN) switch, or a silicon carbide (SiC) switch, or a silicon switch.

In some embodiments, the semiconductor device is a gallium nitride (GaN) diode, or a silicon carbide (SiC) diode, or a silicon diode.

In some embodiments, the semiconductor device is electrically coupled to the PCB.

In some embodiments, the opening is filled with thermally conductive material.

In some embodiments, the insert is thermally coupled to the shield.

In some embodiments, a thermally conductive interface is disposed between the shield and the PCB.

In some embodiments, a thermally conductive interface is disposed between the PCB and the semiconductor device.

In some embodiments, a method of forming an electronic device is disclosed. The method includes providing a printed circuit board (PCB) having a first surface and a second surface opposite the first surface, where the PCB includes a thermally conductive region having a plurality of vias that extend from the first surface to the second surface; attaching a semiconductor device to the second surface of the PCB overlying the thermally conductive region; providing transformer having a magnetic core; providing a shield arranged to partially enclose the transformer, the shield defining an opening; disposing an insert within the opening; and attaching the insert to the first surface of the PCB, where the insert is disposed in a region overlying the thermally conductive region.

DETAILED DESCRIPTION

Figure 1:
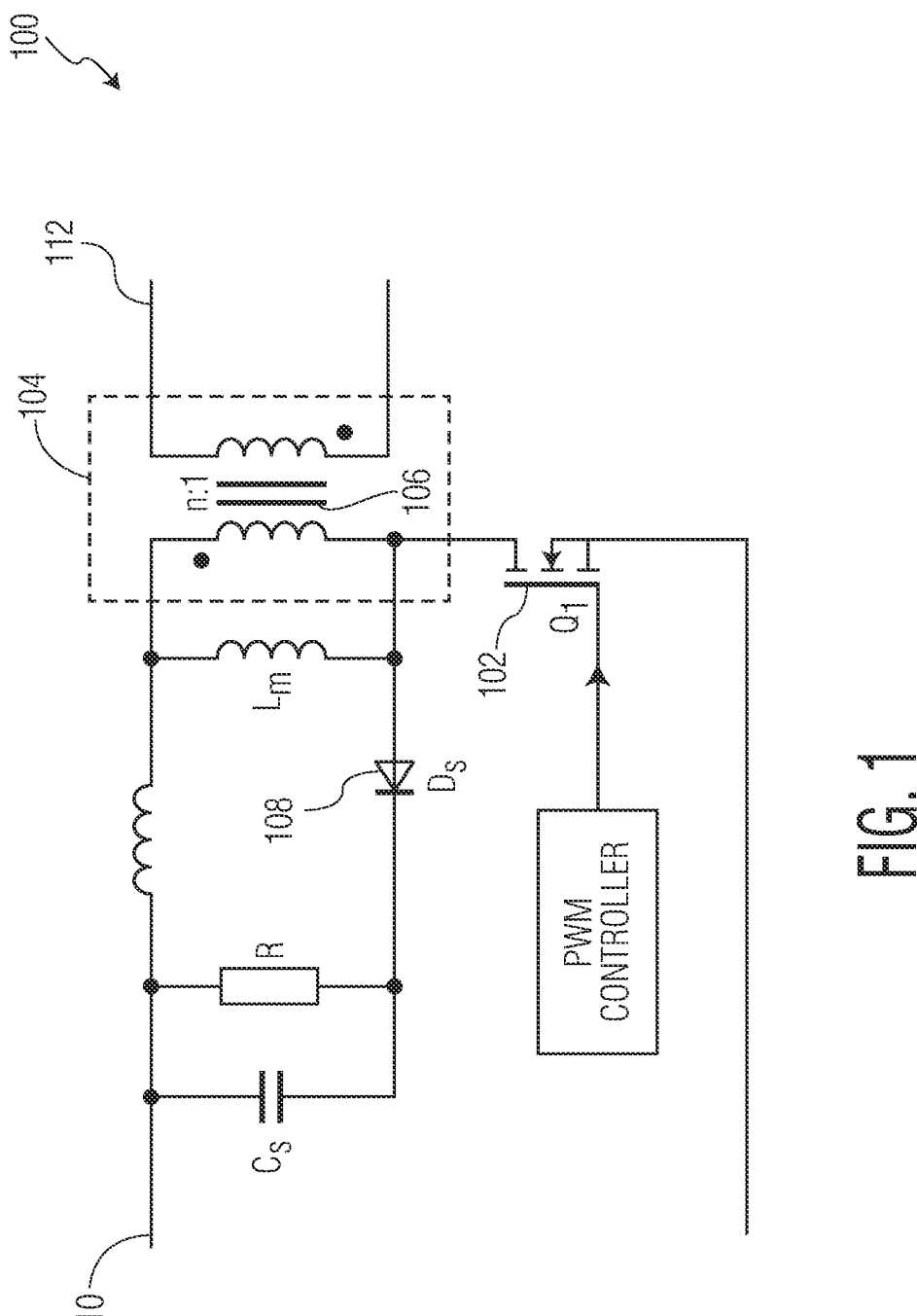
FIG. 1 illustrates a power converter circuit according to some embodiment of the disclosure.

Circuits, devices and related techniques disclosed herein relate generally to power converters. More specifically, circuits, devices and related techniques disclosed herein relate to switching power converter modules with heat dissipation structures. In some embodiments, a power converter can include a heat dissipation structure to improve the temperature performance of the power converter by balancing the temperature of internal components of the power converter. In various embodiments, the power converter can include a printed circuit board (PCB) having a first surface and a second surface opposite the first surface, where the PCB may have a thermally conductive region with a plurality of vias that extend from the first surface to the second surface, a semiconductor device attached to the second surface of the PCB and overlying the thermally conductive region, a transformer having a magnetic core, a shield arranged to partially enclose the transformer and define an opening, and an insert disposed within the opening and attached to the first surface of the PCB and overlying the thermally conductive region.

The shield, which may also be referred to as a sheath, can be arranged to function as an electromagnet interference (EMI) shield, or a safety shield. The shield may be formed from materials such as, but not limited to, steal and/or copper. The sheath may enclose the magnetic core of the transformer and can be arranged to enable efficient removal of the heat generated by the semiconductor device, because the magnetic core of the transformer can have a relatively larger volume compared to the semiconductor device and therefor can be better suited to dissipate the heat generated by the semiconductor device. In some embodiments, the semiconductor device may be a gallium nitride (GaN) based power switch, a silicon carbide (SiC) based power switch, or a silicon power switch. In various embodiments, the semiconductor device may be a GaN-based, silicone based, or silicon carbide based diode.

In some embodiments, wide-bandgap semiconductor devices, such as, but not limited to, GaN-based switches or SiC-based switches may be used in switching power supplies to increase switching frequency and power density of the power supply as compared to traditional silicon-based power supplies. However, in the wide-bandgap semiconductor device based switching power supply module, relatively higher switching frequencies and power densities may cause the switching power converter to operate at relatively high operating temperatures. Embodiments of the disclosure enable efficient transfer of the heat generated by the wide-bandgap semiconductor device to the magnetic core of the transformer through a plurality of vias and relatively high-performance thermally conductive material, thereby reducing the temperature of the wide-bandgap power device. In various embodiments, a thermally conductive interface may be disposed between the PCB and the insert, and/or between the insert and the transformer. Embodiments of the disclosure can also enable reduction of operating temperature of other semiconductor components within the switching power supply. In this way, the temperature of the internal components of the switching power converter module can be kept relatively balanced. Various inventive embodiments are described herein, including methods, processes, systems, devices, and the like.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a schematic of power converter circuit 100 according to an embodiment of the disclosure. In some embodiments, the power converter may be referred to as an electronic device. As shown in FIG. 1, the power converter circuit 100 can include a semiconductor switch 102, a transformer 104 with a magnetic core 106 and a diode 108. The power converter circuit 100 may be arranged to convert a first DC voltage at an input terminal 110 to a second DC voltage at an output terminal 112.

Figure 2A:
FIG. 2A is a cross-sectional view of a power converter heat dissipation structure, according to some embodiments.

FIG. 2A is a cross-sectional view of a heat dissipation structure 200, according to some embodiments. The heat dissipation structure 200 can include a bottom enclosure 202, an semiconductor device 204, such as but not limited to, a power switch, a printed circuit board 206, a sheath 208 with thermally conductive material 210, a magnetic element 212, and a top enclosure 214. The thermally conductive material 210 can include a material with a relatively high-performance conductivity, such as but not limited to, copper or aluminum, or a metal alloy thereof. The semiconductor device 204 and the magnetic element 212 can be welded on different sides of the printed circuit board 206. In some embodiments, the insert may be attached to the sheath by welding, soldering, brazing or swagging process. The sheath 208, the thermally conductive material 210 and the magnetic element 212 may be disposed on the same side of the printed circuit board 206. In various embodiments, the sheath 208 can be used to enclose the magnetic element 212 so that the magnetic element 212 can meet safety specifications. The sheath may be attached to the PCB by mechanical fasteners, clips or bolts, or other suitable attaching means. The heat from the semiconductor device 204 may transfer to the magnetic element 212 through the heat transfer path 220.

Figure 2B:
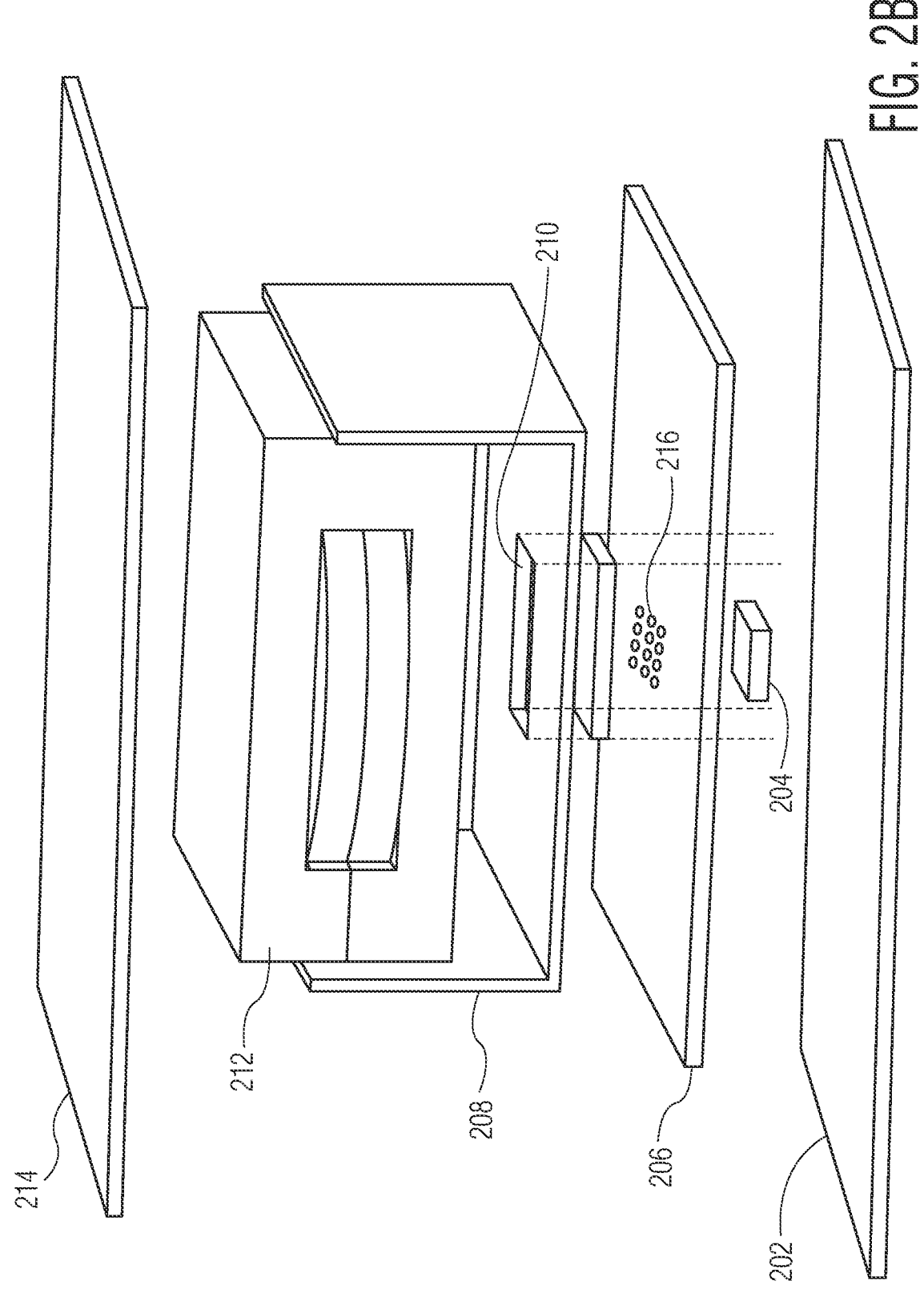
FIG. 2B is an isometric view of the power converter heat dissipation structure of FIG. 2A, according to some embodiments.

FIG. 2B is an isometric view of the heat dissipation structure 200, according to some embodiments. As shown in FIGS. 2A-2B, a plurality of vias 216 can be placed in a region of the printed circuit board 206 adjacent to the semiconductor device 204. The plurality of vias 216 can be arranged to efficiently reduce a thermal resistance of the printed circuit board 206 and to transfer a heat generated by the semiconductor device 204 to the opposite side of the printed circuit board 206. In some embodiments, a region of the sheath 208 that is in contact with the printed circuit board 206 may be hollowed out and the thermally conductive material 210 may be placed therein. The thermally conductive material 210 can be placed inside the hollowed region of sheath 208, and a first side of the thermally conductive material 210 can be directly coupled to the plurality of vias 216, and the opposite side can be directly coupled to the magnetic element 212. In some embodiments, the thermally conductive material may be a material with very low thermal resistance, such as but not limited to, a metal such as copper or aluminum, or a metal alloy thereof. The magnetic element 212 can include a magnetic element such as a transformer or an inductor.

Heat generated by the semiconductor device 204 may be transferred to the magnetic core of the magnetic element 212 through the plurality of vias 216 and the thermally conductive material 210. Due to the large volume of the magnetic core and its relatively high heat dissipation capability, the magnetic core can store relatively large amounts of heat generated by the target device, such as power devices. Thus, temperature of the target device can be efficiently reduced. In this way, a relatively uniform heat profile within the power converter can be achieved without affecting a case temperature of the power converter.

In an exemplary embodiment, the above described techniques can be used for a 120 W power delivery fast charging power converter. In this embodiment, a circuit topology may be a quasi-resonant flyback converter using a gallium nitride (GaN) power switch. A sheath part of the transformer can be hollowed out, and a heat dissipation sheet can be added therein. The heat of the power switch can be transferred to a magnetic core of the transformer through the heat dissipation sheet, which effectively reduces the temperature of the power switch without increasing the case temperature of the switching power supply.

Figures 3A, 3B:
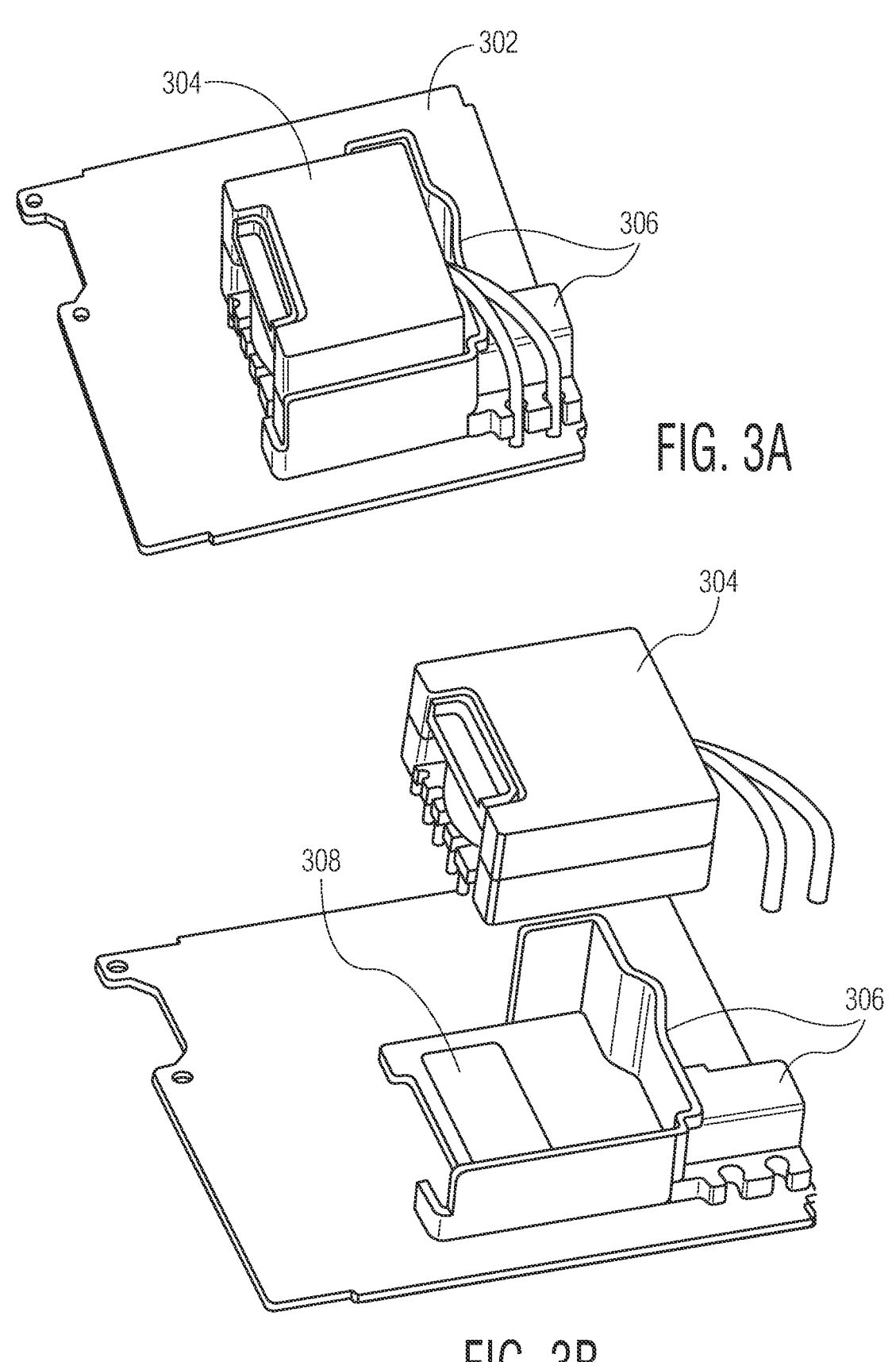
FIGS. 3A-3B show isometric views of a power converter chassis, according to some embodiments of the present disclosure.

FIGS. 3A-3B show isometric views of a power converter according to some embodiments of the present disclosure. As shown in FIGS. 3A-3B, a transformer 304 can be attached on a top surface of a printed circuit board (PCB) 302. An electronic device, such as but not limited to a power switch, can be attached to a bottom surface of the PCB. A sheath 306 may enclose the body of the transformer 304 such that the transformer can be meet safety specifications. As seen in FIG. 3B, the sheath 306 may be partially hollowed out in a region 308 of the sheath and a thermally conductive material, such as but not limited to, copper can be disposed in the region 308 (region 308 may also be referred to as the heat dissipation layer). A region of the printed circuit board 302 in contact with the heat dissipation layer 308 can be provided with a window and a plurality of vias placed therein, and the heat dissipation layer 308 may be directly attached to a heat dissipation pad of the electronic device. During the operation of the flyback converter, heat generated by the electronic device may be transferred to the magnetic core of the transformer through the plurality of vias and the heat dissipation layer 308. Therefore, the temperature of the electronic device can be relatively close to the temperature of the magnetic core of the transformer. Due to the large volume of the magnetic core and its relatively large heat dissipation capability, the temperature of the electronic device and the magnetic core can be maintained within a relatively acceptable range.

In some embodiments, combination of the circuits and methods disclosed herein can be utilized to improve temperature performance of power converters. Although circuits and methods are described and illustrated herein with respect to several particular configuration of a power converter, embodiments of the disclosure are suitable for improving temperature performance of other power converters, such as, but not limited to, push-pull converters and/or buck converters.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. An electronic device comprising:
 a printed circuit board (PCB) having a first surface and a second surface opposite the first surface, wherein the PCB includes a thermally conductive region having a plurality of vias that extend from the first surface to the second surface;
 a semiconductor device attached to the second surface of the PCB and underlying the thermally conductive region;
 a transformer having a magnetic core;
 a shield arranged to partially enclose the transformer and define an opening, the shield attached to the first surface of the PCB; and
 an insert disposed within the opening, attached to the first surface of the PCB and overlying the thermally conductive region.

2. The electronic device of claim 1, wherein the insert is formed from copper, aluminum, or an alloy of copper and/or aluminum.

3. The electronic device of claim 1, wherein the insert is directly coupled to the shield.

4. The electronic device of claim 1, wherein the semiconductor device is a gallium nitride (GaN) switch, or a silicon carbide (SiC) switch, or a silicon switch.

5. The electronic device of claim 1, wherein the semiconductor device is a gallium nitride (GaN) diode, or a silicon carbide (SiC) diode, or a silicon diode.

6. The electronic device of claim 1, wherein the semiconductor device is electrically coupled to the PCB.

7. The electronic device of claim 1, wherein the opening is filled with thermally conductive material.

8. The electronic device of claim 1, wherein the insert is thermally coupled to the shield.

9. The electronic device of claim 1, wherein a thermally conductive interface is disposed between the shield and the PCB.

10. The electronic device of claim 1, wherein a thermally conductive interface is disposed between the PCB and the semiconductor device.

11. A method of forming an electronic device, the method comprising:

provifing a printed circuit board (PCB) having a first surface and a second surface opposite the first surface, wherein the PCB includes a thermally conductive region having a plurality of vias that extend from the first surface to the second surface;

attaching a semiconductor device to the second surface of the PCB, the semiconductor device underlying the thermally conductive region;

providing transformer having a magnetic core;

providing a shield arranged to partially enclose the transformer, the shield defining an opening and attached to the first surface of the PCB;

disposing an insert within the opening; and attaching the insert to the first surface of the PCB, wherein the insert is disposed in a region overlying the thermally conductive region.

12. The method of claim 11, wherein the insert is formed from copper, aluminum, or an alloy of copper and/or aluminum.

13. The method of claim 11, wherein the insert is directly coupled to the shield.

14. The method of claim 11, wherein the semiconductor device is a gallium nitride (GaN) switch, or a silicon carbide (SiC) switch, or a silicon switch.

15. The method of claim 11, wherein the semiconductor device is a gallium nitride (GaN) diode, or a silicon carbide (SiC) diode, or a silicon diode.

16. The method of claim 11, wherein the semiconductor device is electrically coupled to the PCB.

17. The method of claim 11, wherein the opening is filled with thermally conductive material.

18. The method of claim 11, wherein the insert is thermally coupled to the shield.

19. The method of claim 11, wherein a thermally conductive interface is disposed between the shield and the PCB.

20. An electronic device comprising:

a printed circuit board (PCB) having a first surface and a second surface opposite the first surface, wherein the PCB includes a thermally conductive region having a plurality of vias that extend from the first surface to the second surface;

a semiconductor device attached to the second surface of the PCB and underlying the thermally conductive region;

a transformer having a magnetic core;

a shield arranged to partially enclose the transformer and define an opening;

an insert disposed within the opening, attached to the first surface of the PCB and overlying the thermally conductive region; and wherein:

the shield is disposed on a first side of the PCB; and the semiconductor device is disposed on a second side of the PCB that is opposite the first side.

* * * * *